(12) United States Patent
Li et al.

(10) Patent No.: US 8,823,038 B2
(45) Date of Patent: Sep. 2, 2014

(54) SEMICONDUCTOR LIGHT-EMITTING STRUCTURE

(75) Inventors: Jun-Sheng Li, Taichung (TW);
Kuo-Chen Wu, Taichung (TW);
Wei-Chih Wen, Taichung (TW)

(73) Assignee: Huga Optotech Inc., Taichung (TW)

( * ) Notice: Subject to any disclaimer, the term of this patent is extended or adjusted under 35 U.S.C. 154(b) by 0 days.

(21) Appl. No.: 13/447,284

(22) Filed: Apr. 16, 2012

(65) Prior Publication Data

US 2012/0292657 A1 Nov. 22, 2012

(30) Foreign Application Priority Data

May 20, 2011 (TW) .............................. 100117781 A

(51) Int. Cl.
*H01L 33/00* (2010.01)
*H01L 33/20* (2010.01)
*H01L 33/38* (2010.01)
*H01L 33/40* (2010.01)

(52) U.S. Cl.
CPC .................. *H01L 33/20* (2013.01); *H01L 33/40* (2013.01); *H01L 33/38* (2013.01)
USPC .................. 257/99; 257/98; 257/100; 438/46

(58) Field of Classification Search
USPC ......................................... 257/98, 99; 438/46
See application file for complete search history.

(56) References Cited

U.S. PATENT DOCUMENTS

| 7,902,565 B2 * | 3/2011 | Katsuno et al. ................. 257/98 |
| 2010/0012968 A1 * | 1/2010 | Yahata et al. ................... 257/99 |
| 2010/0072508 A1 | 3/2010 | Kamiya et al. |
| 2010/0193812 A1 | 8/2010 | Kao et al. |
| 2011/0220942 A1 * | 9/2011 | Choi et al. ..................... 257/98 |
| 2012/0223357 A1 * | 9/2012 | Jeon .............................. 257/99 |

FOREIGN PATENT DOCUMENTS

| EP | 2 239 791 A2 | 10/2010 |
| TW | 569464 B | 1/2004 |
| TW | 2004114556 | 8/2004 |
| TW | M318195 U | 9/2007 |

* cited by examiner

*Primary Examiner* — Matthew W Such
*Assistant Examiner* — Frederick B Hargrove
(74) *Attorney, Agent, or Firm* — Muncy, Geissler, Olds & Lowe, P.C.

(57) ABSTRACT

A semiconductor light-emitting structure is provided, which includes a first doped type semiconductor layer, a light-emitting layer, a second doped type semiconductor layer, a first electrical transmission layer and at least one first conductor. The light-emitting layer is disposed on the first doped type semiconductor layer and the second doped type semiconductor layer is disposed on the light-emitting layer. The first electrical transmission layer is disposed on the first doped type semiconductor layer, in which a first interface is formed between the first electrical transmission layer and the first doped type semiconductor layer. The first conductor is disposed on the first doped type semiconductor layer. The first electrical transmission layer connects the first conductor. A second interface is formed between each of the first conductor and the first doped type semiconductor layer, and the resistance of the second interface is less than the resistance of the first interface.

19 Claims, 5 Drawing Sheets

SEMICONDUCTOR LIGHT-EMITTING STRUCTURE

CROSS-REFERENCE TO RELATED APPLICATION

This application claims the priority benefit of Taiwan application serial no. 100117781, filed on May 20, 2011. The entirety of the above-mentioned patent application is hereby incorporated by reference herein and made a part of this specification.

BACKGROUND OF THE INVENTION

1. Field of the Invention

The invention generally relates to a light-emitting structure, and more particularly, to a semiconductor light-emitting structure.

2. Description of Related Art

Along with the progress of photoelectric technology, the fabrication and the application of a light-emitting diode (LED) has gradually reached their ripe stage. Since LEDs have advantages of low pollution, low power consumption, short response time and long lifetime, so that LEDs have been gradually applied in various fields of light source or illumination to substitute traditional light-emitting components such as fluorescent lamp, incandescent bulb or halogen bulb. Around the world, environmental awareness is growing and growing and thus it can be expected the LEDs would become the major illumination light source in the future to substitute the current position of the fluorescent lamp.

In general speaking, the LED's electrode disposing way can be categorized into horizontal disposing way and vertical disposing way, in which the horizontal disposing way means the two positive and negative electrodes are disposed at a same side of an LED epitaxy structure, while the vertical disposing way means the two positive and negative electrodes are respectively disposed at two opposite sides of an LED epitaxy structure. In more details, in an LED structure with the horizontal disposing way of its electrodes, the positive electrode is disposed on a p-type semiconductor layer, while the negative electrode is disposed on an n-type semiconductor layer, and the two electrodes are not overlapped with each other on a direction perpendicularly to the light-emitting layer thereof. Usually, the two electrodes are made of non-transparent metal. When the distribution area of the two electrodes is small, the situation that the light emitted from the light-emitting layer is blocked by the two electrodes can be reduced and the light extraction rate can be accordingly not decreased, however, the current flowing from the p-type semiconductor layer to the n-type semiconductor layer would be excessively concentrated in a small area between the two electrodes. As a result of excessively concentrated current distribution, it leads to non-uniformity of the emitted light and to heat-dissipation difficulty and easier damage of the LED due to the excessively concentrated heat produced during the current passing, and the LED's light-emitting efficiency is reduced. On the other hand, when the distribution range between the two electrodes is increased by design, the excessively concentrated current distribution problem can be lightened, but the electrodes would block too much light, which leads to largely reducing the light extraction rate.

SUMMARY OF THE INVENTION

Accordingly, the invention is directed to a semiconductor light-emitting structure capable of effectively advancing the uniformity of the exiting light.

An embodiment of the invention provides a semiconductor light-emitting structure, which includes a substrate, a first doped type semiconductor layer, a light-emitting layer, a second doped type semiconductor layer, a first electrical transmission layer and at least one first conductor. The first doped type semiconductor layer is disposed over the substrate. The light-emitting layer is disposed over the first doped type semiconductor layer and the second doped type semiconductor layer is disposed over the light-emitting layer. The first electrical transmission layer is disposed on the first doped type semiconductor layer, in which a first interface is formed between the first electrical transmission layer and the first doped type semiconductor layer. The first conductor is disposed on the first doped type semiconductor layer. A second interface is formed between the first conductor and the first doped type semiconductor layer, and the resistance of the second interface is less than the resistance of the first interface.

Another embodiment of the invention also provides a semiconductor light-emitting structure, which includes a substrate, an n-type semiconductor layer, a light-emitting layer, a p-type semiconductor layer, a first electrical transmission layer and at least one first conductor. The n-type semiconductor layer is disposed over the substrate. The light-emitting layer is disposed over the n-type semiconductor layer and the p-type semiconductor layer is disposed over the light-emitting layer. The first electrical transmission layer is disposed on the n-type semiconductor layer. The first conductor is disposed on the n-type semiconductor layer and passes through the first electrical transmission layer to connect the n-type semiconductor layer.

In the semiconductor light-emitting structure of the embodiments of the invention, the first electrical transmission layer connected to the first conductors serves as an extension of the first conductors, so that the semiconductor light-emitting structure of the embodiments of the invention can make the current more dispersed. In this way, the semiconductor light-emitting structure of the embodiments of the invention can effectively resolve the problem of non-uniform current distribution and thereby advance the light exiting efficiency.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
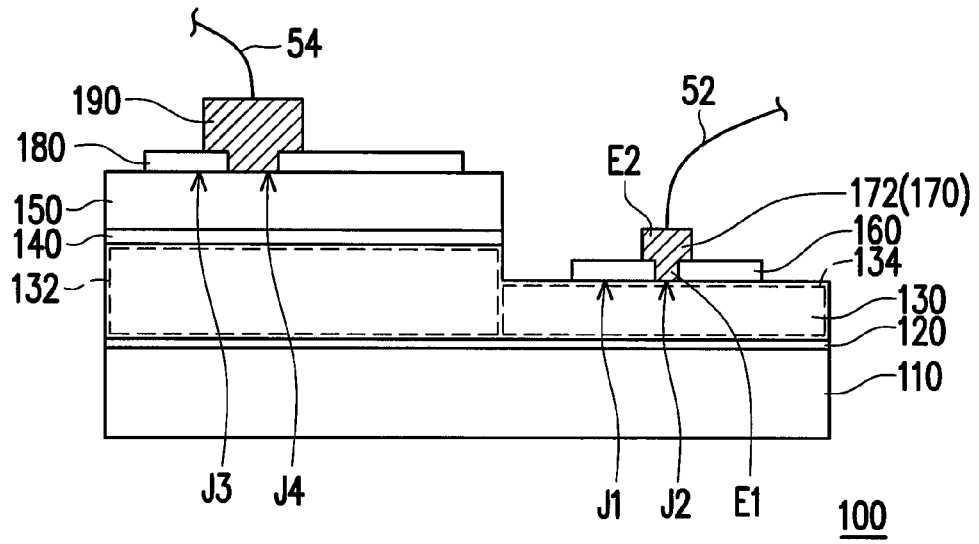
FIG. 1A is a cross-sectional schematic diagram of a semiconductor light-emitting structure according to an embodiment of the invention.
Figure 1B:
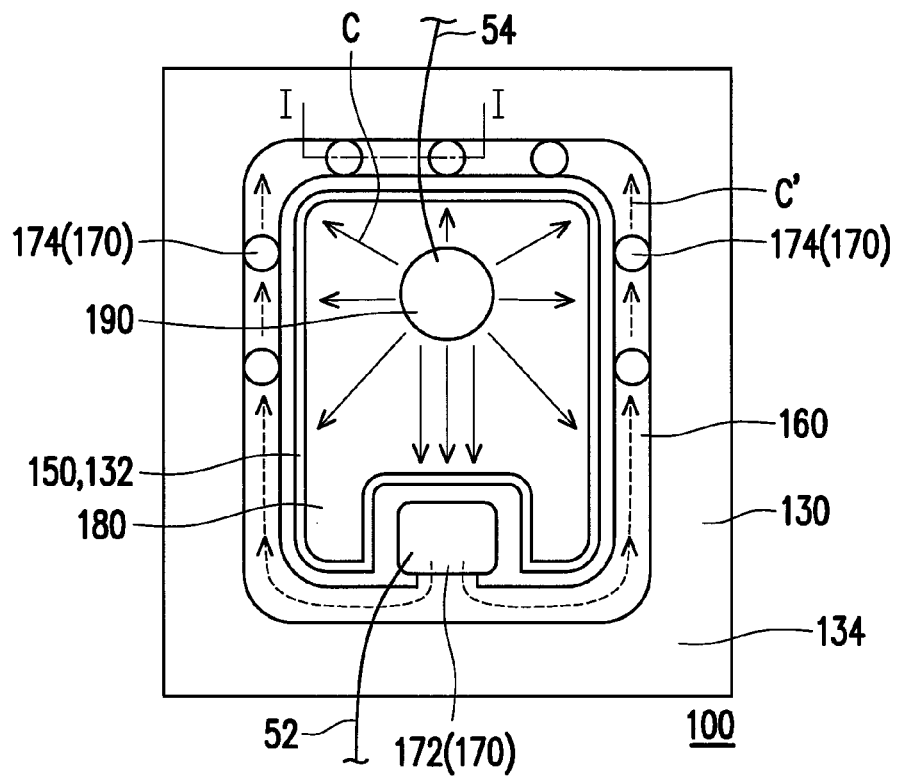
FIG. 1B is a top-view schematic diagram of the semiconductor light-emitting structure of FIG. 1A.
Figure 1C:
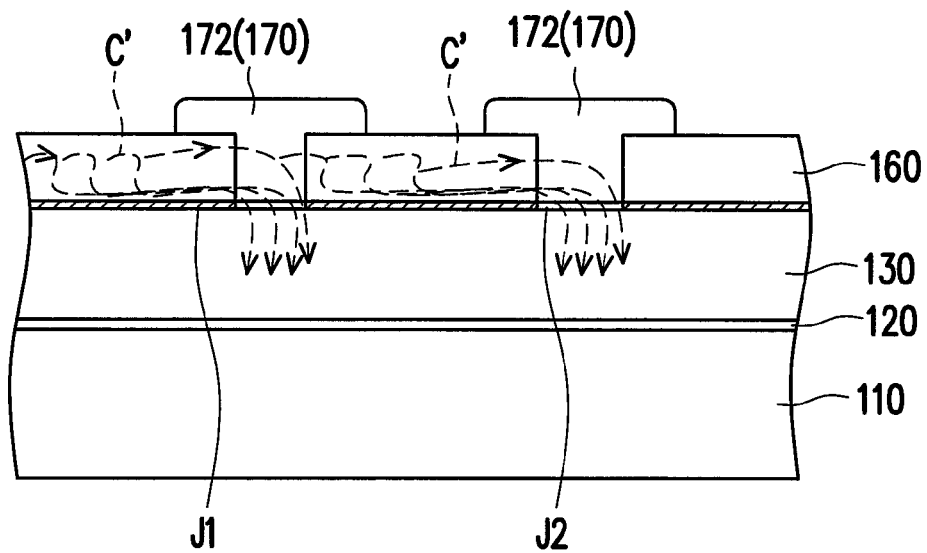
FIG. 1C is a localized cross-sectional schematic diagram of the semiconductor light-emitting structure of FIG. 1B along line I-I.

FIG. 1A is a cross-sectional schematic diagram of a semiconductor light-emitting structure according to an embodiment of the invention, FIG. 1B is a top-view schematic diagram of the semiconductor light-emitting structure of FIG. 1A and FIG. 1C is a localized cross-sectional schematic diagram of the semiconductor light-emitting structure of FIG. 1B along line I-I. Referring to FIGS. 1A-1C, a semiconductor light-emitting structure 100 of the embodiment is, for example, an LED die structure and includes a first doped type semiconductor layer 130, a light-emitting layer 140, a second doped type semiconductor layer 150, a first electrical transmission layer 160 and at least a first conductor 170 (in the embodiment, it is a plurality of first conductors 170 as an example). The light-emitting layer 140 is disposed over the first doped type semiconductor layer 130 and the second doped type semiconductor layer 150 is disposed over the light-emitting layer 140. In the embodiment, the first doped type semiconductor layer 130 is an n-type semiconductor layer and the second doped type semiconductor layer 150 is a p-type semiconductor layer. Taking an example, the first doped type semiconductor layer 130 is, for example, n-type gallium nitride (GaN) layer, and the second doped type semiconductor layer 150 is, for example, p-type GaN layer. In other embodiments however, the first doped type semiconductor layer 130 and the second doped type semiconductor layer 150 can be other semiconductor layers suitable for fabricating a light-emitting component, for example, other semiconductor layers with chemical elements of groups III-V or II-VI. In addition, the light-emitting layer 140 is, for example, a quantum well layer or multiple quantum well layers. In the embodiment, the semiconductor light-emitting structure 100 further includes a substrate 110 and a buffer layer 120, in which the buffer layer 120 is disposed between the substrate 110 and the first doped type semiconductor layer 130. In the embodiment, the substrate 110 is a nonconductive substrate, for example, a sapphire substrate. In other embodiments, the substrate 110 can be other appropriate substrates.

In the embodiment, the first electrical transmission layer 160 is disposed on the first doped type semiconductor layer 130, and the first conductors 170 are disposed on the first doped type semiconductor layer 130 and pass through the first electrical transmission layer 160 to connect the first doped type semiconductor layer 130. In the embodiment, the first conductors 170 are separately disposed on the first doped type semiconductor layer 130 and the first electrical transmission layer 160 connects the first conductors 170. In addition, in the embodiment, a first interface J1 is formed between the first electrical transmission layer 160 and the first doped type semiconductor layer 130, a second interface J2 is formed between each of the first conductors 170 and the first doped type semiconductor layer 130, and the resistance of the second interface J2 is less than the resistance of the first interface J1.

In the embodiment, each of the first conductors 170 passes through the first electrical transmission layer 160 and has a first end E1 and a second end E2 opposite to the first end E1. The first end E1 contacts the first doped type semiconductor layer 130 to form the second interface J2, while the second end E2 is exposed outside the first electrical transmission layer 160. In the embodiment, the first conductors 170 are, for example, respectively a metallic conductor. Taking an example, the metallic conductor is, for example, clad metal layers, which are, for example, chrome layer and gold layer sequentially-stacked from the position close to an end of the second interface J2 (the first end E1) to the position far away from another end of the second interface J2 (the second end E2), or, for example, chrome layer, platinum layer and gold layer sequentially-stacked from the position close to an end of the second interface J2 (the first end E1) to the position far away from another end of the second interface J2 (the second end E2), which the invention is not limited to. Moreover in the embodiment, the second interface J2 is, for example, an ohmic contact surface and the first interface J1 is, for example, a Schottky contact surface, which the invention is not limited to.

One of the first conductors 170 (for example, first conductor 172) in the embodiment is an electrode connecting external power serving for connecting an external conductive path, in which the volume of the electrode connecting external power is greater than the volume of each of the other first conductors 170. For example, the electrode connecting external power (the first conductor 172) can be electrically connected to an external power through a bonding wire 52; in other embodiments, the electrode connecting external power (the first conductor 172) can be electrically connected to an external power through a conductive bump or other conductive structures. In the embodiment, the disposing pattern of the first conductors 170 includes spot-shaped distribution pattern; in other embodiments however, the pattern of the first conductors 172 includes at least one of a line-shaped pattern, a mesh-shaped pattern and a spot-shaped pattern.

The first doped type semiconductor layer 130 of the embodiment includes a platform portion 132 and a sink portion 134, and the thickness of the platform portion 132 is greater than the thickness of the sink portion 134. The light-emitting layer 140 and the second doped type semiconductor layer 150 are disposed over the platform portion 132, while the first conductors 170 and the first electrical transmission layer 160 are disposed on the sink portion 134.

The semiconductor light-emitting structure 100 of the embodiment further includes a second electrical transmission layer 180 and a second conductor 190. The second electrical transmission layer 180 is disposed on the second doped type semiconductor layer 150 and the second conductor 190 passes through the second electrical transmission layer 180 to connect the second doped type semiconductor layer 150. In the embodiment, a third interface J3 is formed between the second electrical transmission layer 180 and the second doped type semiconductor layer 150, a fourth interface J4 is formed between the second conductor 190 and the second doped type semiconductor layer 150, and the resistance of the fourth interface J4 is greater than the resistance of the third interface J3.

In the embodiment, the second conductor 190 is, for example, a metallic conductor. Taking an example, the metallic conductor is, for example, clad metal layers, which are, for example, chrome layer and gold layer sequentially-stacked from the position close to an end of the fourth interface J4 to the position far away from another end of the fourth interface J4, or for example, chrome layer, platinum layer and gold layer sequentially-stacked from the position close to an end of the fourth interface J4 to the position far away from another end of the fourth interface J4, which the invention is not limited to.

In the embodiment, the second conductor 190 is an electrode connecting external power serving for connecting an external conductive path. For example, the second conductor 190 can be electrically connected to an external power through a bonding wire 54; in other embodiments, the second conductor 190 can be electrically connected to an external power through a conductive bump or other conductive structures.

The material of the first electrical transmission layer 160 and the second electrical transmission layer 180 of the embodiment includes transparent material or semi-transparent material. For example, the first electrically conductive layer 160 and the second electrically conductive layer 180 are respectively a transparent conductive layer, for example, respectively an indium tin oxide (ITO) layer after being annealed and the annealing processing temperature $T_a$ meets the condition of $500°\,C.\leq T_a \leq 600°\,C$.

In the semiconductor light-emitting structure 100 of the embodiment, since the first electrical transmission layer 160 connected to the first conductors 170 is adopted for serving as an extension of the first conductors 170 to make the current more dispersed and the first electrical transmission layer 160 selects a transparent material or a semi-transparent material to allow light passing through, so that the semiconductor light-emitting structure 100 of the embodiment is advantageous in making the current more dispersed and not reducing the light extraction rate. In this way, the semiconductor light-emitting structure 100 of the embodiment can effectively advance the light efficiency and the light uniformity. In more details, holes C come from the second conductor 190 would dispersedly flow towards the first conductors 170 and the first electrical transmission layer 160, followed by flowing to the light-emitting layer 140 via the second doped type semiconductor layer 150. On the other hand, since the resistance of the second interface J2 is less than the resistance of the first interface J1, electrons C' come from all the first conductors 170 (including the first conductor 172 serving as the electrode connecting external power and the other first conductors 174 except for the electrode connecting external power) are likely injected into the first doped type semiconductor layer 130 via the second interface J2. Thus, a part of the electrons C' come from the first conductor 172 is injected into the first doped type semiconductor layer 130 via the second interface J2, while the other part would laterally flow to the first conductors 174 via the first electrical transmission layer 160, and then, the electrons C' are injected into the first doped type semiconductor layer 130 via the second interface J2. After that, the electrons C' injected into the first doped type semiconductor layer 130 would continuously flow to the light-emitting layer 140 to recombine with the holes C located in the light-emitting layer 140 to emit light. It can be seen the semiconductor light-emitting structure 100 of the embodiments certainly makes the current more dispersed. The dispersed current results in more dispersed distribution of the interface temperature of the semiconductor light-emitting structure 100 produced during operation in the embodiment, which thereby enables the semiconductor light-emitting structure 100 keeping higher light-emitting efficiency during operation and unlikely damaged so as to have longer lifetime.

In the embodiment, both the first electrical transmission layer 160 and the first conductors 170 can surround the platform portion 132 so as to further advance the dispersed extent of the current. However, the distribution positions of the first conductors 170 in the invention are not limited to the layout of FIG. 1B. The distribution positions of the first conductors 170 can determine the position where the electrons C' are injected into the first doped type semiconductor layer 130 and determine the distribution status of the current, so that in other embodiments, the distribution positions of the first conductors 170 can be designed appropriately to make the distribution status of the current meet requirement. Usually, the distribution areas of the first conductors 170 are increased with the increase of the distances between the first conductors 170 except for the electrode 172 connecting external power and the electrode 172 connecting external power, so that the current can be further more uniform and dispersed.

In the embodiment, an annealing processing is performed on the first electrical transmission layer 160, so that the resistances of the first electrical transmission layer 160 and the first interface J1 meet an expected value.

The resistance of the fourth interface J4 is greater than the resistance of the third interface J3, and therefore the fourth interface J4 can serve as a current-blocking structure to reduce the current passing through under the second conductor 190, that is because if the current formed above the second conductor 190 passes through the light-emitting layer 140 under the second conductor 190, the light-emitting layer 140 would emit light, but the light emitted from the light-emitting layer 140 under the second conductor 190 is easily blocked by the second conductor 190 so as to reduce the light efficiency. On the contrary, by using the fourth interface J4 to block the current formed under the second conductor 190 in the embodiment, the current passing through the third interface J3 is increased, which further reduces the proportion of the light emitted from the light-emitting layer 140 but blocked by the second conductor 190 so as to advance the light efficiency of the semiconductor light-emitting structure 100.

Figure 2:
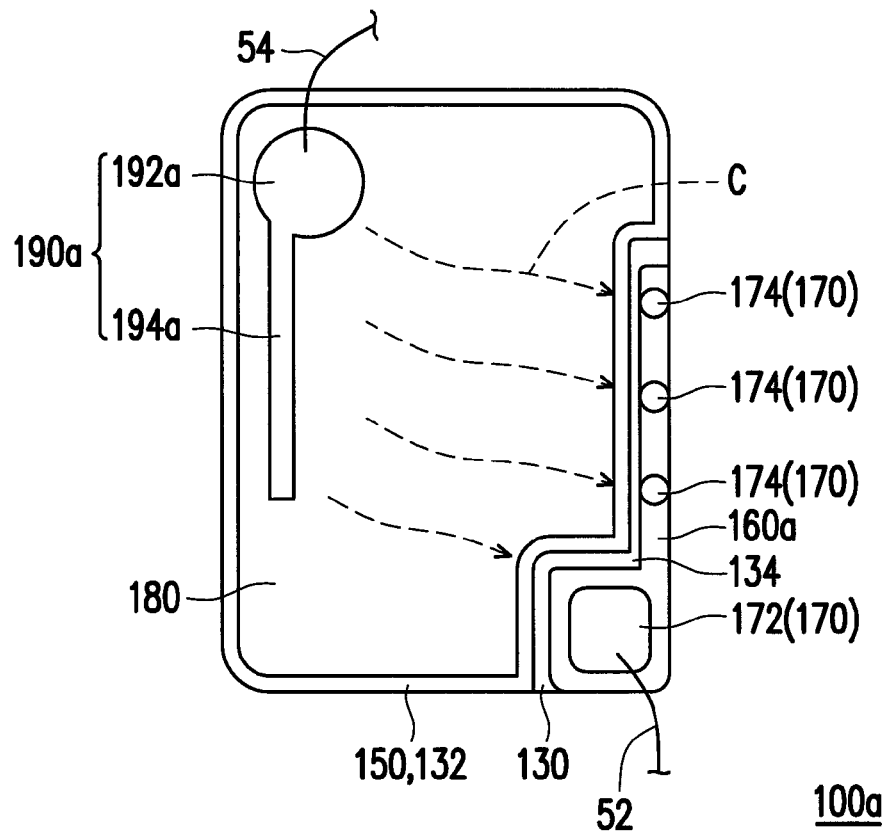
FIG. 2 is a top-view schematic diagram of a semiconductor light-emitting structure according to another embodiment of the invention.

FIG. 2 is a top-view schematic diagram of a semiconductor light-emitting structure according to another embodiment of the invention. The semiconductor light-emitting structure 100a is similar to the semiconductor light-emitting structure 100 of FIGS. 1A-1C except that in the semiconductor light-emitting structure 100a of the embodiment, both the first electrical transmission layer 160a and the first conductors 170 are disposed at a same side of the platform portion 132. In addition, the second conductor 190a of the embodiment includes a bonding portion 192a and an extension portion 194a connected to the bonding portion 192a, in which the bonding portion 192a serves for connecting an external power and the extension portion 194a is an extension of the bonding portion 192a of the second conductor 190a. With the design, the current can dispersedly flow between the second conductor 190a and the first electrical transmission layer 160a. The semiconductor light-emitting structure 100a of the embodiment has the same advantages and effect of the semiconductor light-emitting structure 100 in the foregoing embodiment, which is omitted to describe.

Figure 3:
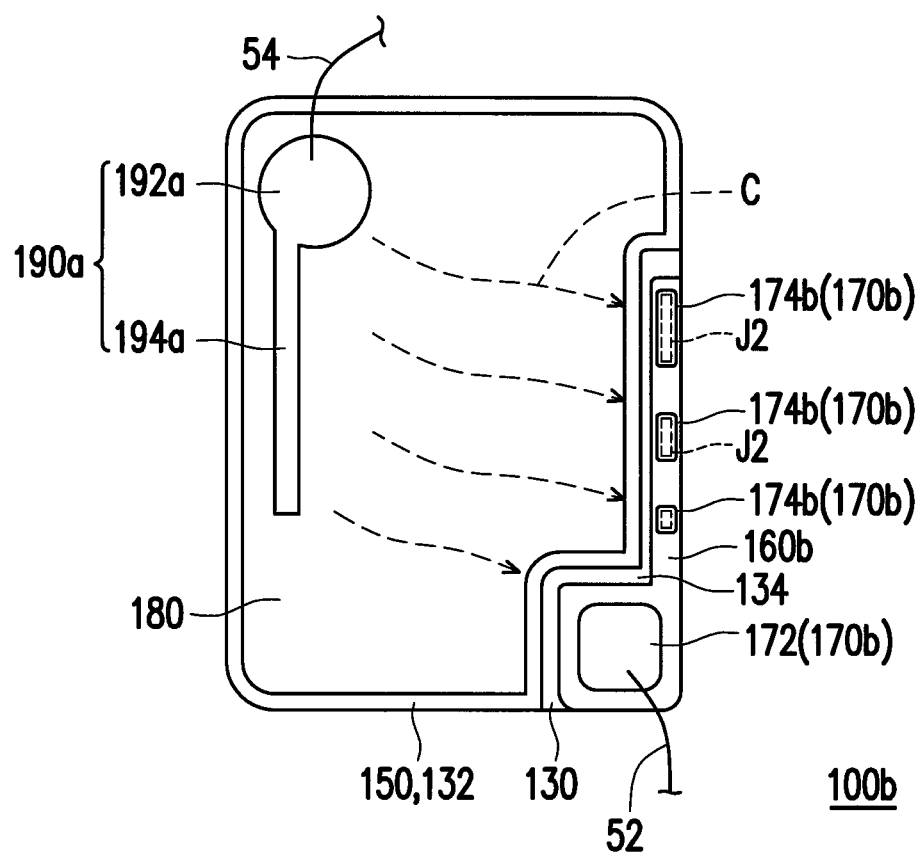
FIG. 3 is a top-view schematic diagram of a semiconductor light-emitting structure according to yet another embodiment of the invention.

FIG. 3 is a top-view schematic diagram of a semiconductor light-emitting structure according to yet another embodiment of the invention. The semiconductor light-emitting structure 100b of the embodiment is similar to the semiconductor light-emitting structure 100a of FIG. 2 except that among the first conductors 170b of the semiconductor light-emitting structure 100b of the embodiment, for the first conductors 174b (belonging to 170b) except for the first conductor 172 serving as an electrode connecting external power and connected to the bonding wire 54, the distribution area of the first conductors 174b are increased with the increase of the distances between the first conductors 174b and the first conductor 172. The larger the area of the second interface/interfaces J2 of the first conductor/conductors 174b is, the smaller the resistance for the current to flow through the second interface/interfaces J2 is and the easier the current flows through, which is helpful to further advance the uniformity of the current flowing from the second conductor 190a to the first electrical transmission layer 160b.

Figure 4A:
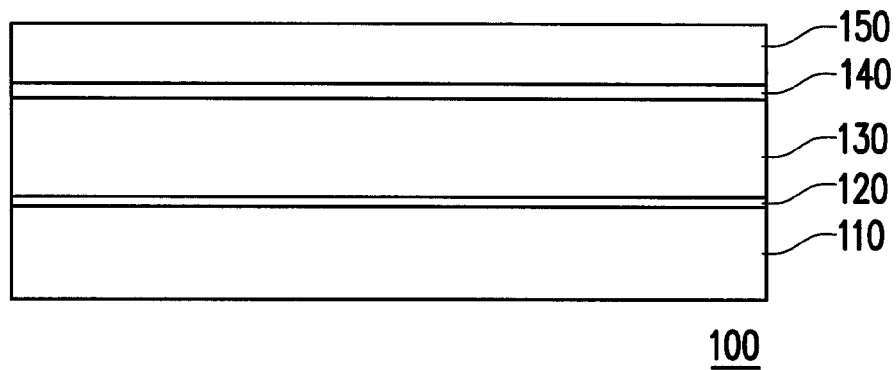
FIGS. 4A-4E are schematic flowcharts showing a fabrication method of semiconductor light-emitting structure according to an embodiment of the invention.
Figure 4B:
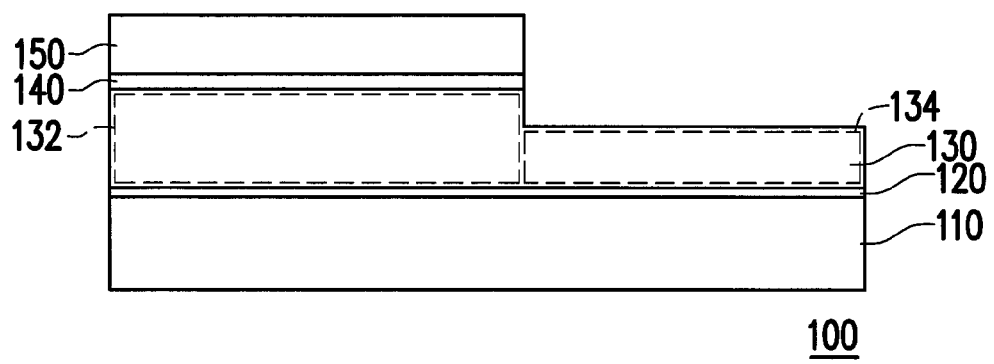

FIGS. 4A-4E are schematic flowcharts showing a fabrication method of semiconductor light-emitting structure according to an embodiment of the invention. Referring to FIGS. 4A-4E, a fabrication method of semiconductor light-emitting structure of the embodiment is suitable to fabricate the above-mentioned semiconductor light-emitting structures 100,100a and 100b, and in the following, the semiconductor light-emitting structure 100 is selected to describe the fabrication method. The fabrication method of semiconductor light-emitting structure 100 of the embodiment includes following steps. First as shown by FIG. 4A, a substrate 110 is provided. Next, a buffer layer 120, a first doped type semiconductor layer 130, a light-emitting layer 140 and a second doped type semiconductor layer 150 are sequentially formed on the substrate 110. Then as shown by FIG. 4B, an etching processing is performed on a part of the second doped type semiconductor layer 150, a part of the light-emitting layer 140 and a part of the first doped type semiconductor layer 130 so as to form a platform portion 132 and a sink portion 134, and the rest non-etched light-emitting layer 140 and second doped type semiconductor layer 150 are located on the platform portion 132.

Figure 4C:
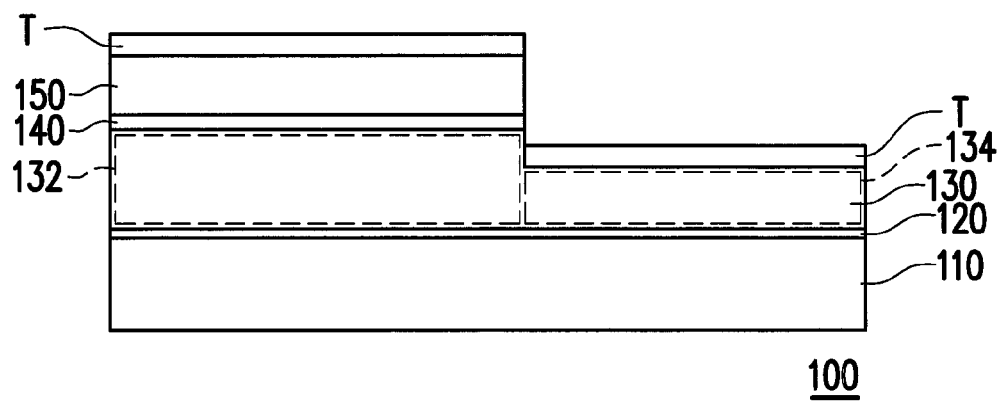
Figure 4D:
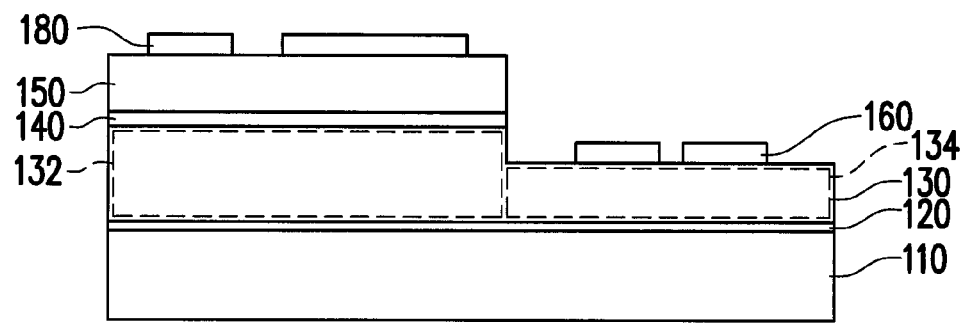
Figure 4E:
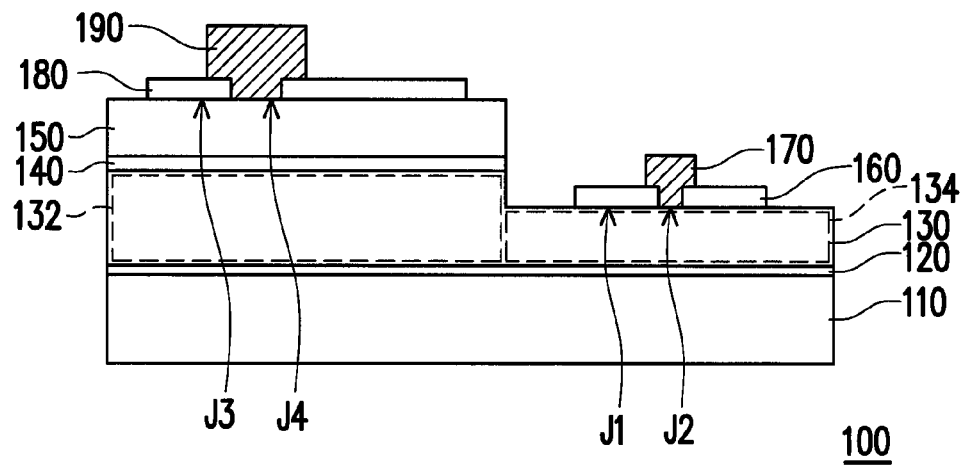

After that as shown by FIG. 4C, an electrical transmission layer T wholly covering the second doped type semiconductor layer 150 and the sink portion 134 is formed. In the embodiment, the material of the electrical transmission layer T includes transparent material or semi-transparent material. Taking an example, the electrical transmission layer T is a transparent conductive layer, for example, an ITO layer. Further as shown by FIG. 4D, a patterning process is performed on the electrical transmission layer T to form a first electrical transmission layer 160 and a second electrical transmission layer 180. The patterning process includes forming a photoresist layer, exposing a partial photoresist layer with a mask, developing the photoresist layer, and using the residual photoresist layer as an etching-blocking layer to perform an etching process on a part of the electrical transmission layer T so as to make the electrical transmission layer T patterned. Further, the above-mentioned annealing processing is performed on the first electrical transmission layer 160 and the second electrical transmission layer 180, in which the annealing processing temperature $T_a$ meets the condition of $500°C. \leq T_a \leq 600°C$. Then as shown by FIG. 4E, a plurality of first conductors 170 are formed on the first doped type semiconductor layer 130 and a second conductor 190 is formed on the second doped type semiconductor layer 150. At the time, the semiconductor light-emitting structure 100 of the embodiment is completed.

In the fabrication method of semiconductor light-emitting structure 100 of the embodiment, since the first electrical transmission layer 160 is processed by annealing, so that the resistance of the second interface J2 is less than the resistance of the first interface J1.

In summary, in the semiconductor light-emitting structure of the embodiments of the invention, the first electrical transmission layer connected to the first conductors serves as an extension of the first conductors and the first electrical transmission layer is suitable to allow light passing through, so that the semiconductor light-emitting structure of the embodiments of the invention can make the current more dispersed, and meanwhile, the light extraction rate unlikely gets loss. In this way, the semiconductor light-emitting structure of the embodiments of the invention can effectively advance the light efficiency and the light uniformity. In addition, since the current is more dispersed, the heat of the semiconductor light-emitting structure of the embodiments of the invention produced during operation is more dispersed, so that the semiconductor light-emitting structure has better heat-dissipation effect, which enables the semiconductor light-emitting structure keeping higher light-emitting efficiency during operation and unlikely damaged so as to have longer lifetime.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor light-emitting structure, comprising:
   a first semiconductor layer;
   a second semiconductor layer being on the first semiconductor layer;
   a first electrical transmission layer being on the first semiconductor layer and not covered by the second semiconductor layer;
   a plurality of first conductors arranged on the first semiconductor layer and surrounded by the first electrical transmission layer; and
   an electrode arranged on the first semiconductor layer and having a volume greater than those of the first conductors,
   wherein the first semiconductor layer has a higher resistance to the first conductors, and a lower resistance to the first electrical transmission layer.

2. The semiconductor light-emitting structure of claim 1, further comprising a nonconductive substrate associated with the first semiconductor layer.

3. The semiconductor light-emitting structure of claim 1, wherein the first conductors are arranged in a configuration of a line-shaped pattern, a mesh-shaped pattern or a spot-shaped pattern.

4. The semiconductor light-emitting structure of claim 1, wherein the first conductors are distributed in a larger area and smaller areas, and the first conductors distributed in the smaller areas are nearer to the electrode than the first conductors distributed in the larger area.

5. The semiconductor light-emitting structure of claim 1, wherein the first semiconductor layer comprises a platform portion connected to the second semiconductor layer, and a sink portion connected to the first conductors and the first electrical transmission layer.

6. The semiconductor light-emitting structure of claim 5, wherein the first electrical transmission layer surrounds the platform portion.

7. The semiconductor light-emitting structure of claim 1, further comprising:
   a second electrical transmission layer on the second semiconductor layer; and
   a second conductor passing through the second electrical transmission layer and connected to the second semiconductor layer.

8. The semiconductor light-emitting structure of claim 1, wherein the first electrical transmission layer comprises a transparent material or a semi-transparent material.

9. The semiconductor light-emitting structure of claim 1, wherein the first semiconductor layer comprises an n-type semiconductor layer, and the second semiconductor layer comprises a p-type semiconductor layer.

10. The semiconductor light-emitting structure of claim 1, wherein the first conductors pass through the first electrical transmission layer.

11. The semiconductor light-emitting structure of claim 1, wherein the first conductors are of the same size.

12. The semiconductor light-emitting structure of claim 1, wherein the first electrical transmission layer surrounds the electrode.

13. The semiconductor light-emitting structure of claim 1, wherein the electrode and the first conductors are directly connected to the first semiconductor layer.

14. The semiconductor light-emitting structure of claim 7, wherein the first conductors and the electrode surround the second conductor.

15. The semiconductor light-emitting structure of claim 7, wherein the second conductor comprises an extension portion.

16. The semiconductor light-emitting structure of claim 14, wherein the first conductors are arranged in a direction which is substantially parallel to the extension portion.

17. The semiconductor light-emitting structure of claim 14, wherein the first semiconductor layer has a portion not covered by the first electrical transmission layer and the second semiconductor layer.

18. The semiconductor light-emitting structure of claim 1, wherein the first semiconductor layer has a portion not covered by the first electrical transmission layer and surrounding the electrode.

19. The semiconductor light-emitting structure of claim 7, wherein the second semiconductor layer has a higher resistance than the second conductor, and a lower resistance than the second electrical transmission layer.

* * * * *